United States Patent
Ishizawa et al.

[11] Patent Number: 6,144,926
[45] Date of Patent: Nov. 7, 2000

[54] METHOD OF SENSING ACCESS POSITIONS OF ARM

[75] Inventors: Shigeru Ishizawa, Yamanashi-ken; Keiichi Matsushima, Kofu, both of Japan

[73] Assignee: Tokyo Electron Limited, Tokyo, Japan

[21] Appl. No.: 09/064,003

[22] Filed: Apr. 21, 1998

[30] Foreign Application Priority Data

Apr. 24, 1997 [JP] Japan ................................. 9-123319

[51] Int. Cl.$^7$ .................................................. G06F 19/00
[52] U.S. Cl. ............................................. 702/94; 700/121
[58] Field of Search .................................... 700/112, 114, 700/121, 229; 702/94; 438/7, 16

[56] References Cited

U.S. PATENT DOCUMENTS

| | | | |
|---|---|---|---|
| 5,468,112 | 11/1995 | Ishii et al. ................................. | 414/416 |
| 5,540,098 | 7/1996 | Ohsawa ....................................... | 73/629 |
| 5,645,391 | 7/1997 | Ohsawa et al. ............................ | 414/416 |
| 5,730,574 | 3/1998 | Adachi et al. ............................. | 414/222 |
| 5,813,819 | 9/1998 | Ohsawa et al. ............................ | 414/416 |
| 5,947,675 | 9/1999 | Matsushima ............................... | 414/416 |
| 5,947,677 | 9/1999 | Matsushima et al. .................... | 414/609 |
| 5,988,971 | 11/1999 | Fossey et al. ............................. | 414/416 |
| 6,013,920 | 1/2000 | Gordon et al. ......................... | 250/559.36 |
| 6,032,083 | 2/2000 | Oosawa ..................................... | 700/218 |

FOREIGN PATENT DOCUMENTS

| 8-64654 | 3/1996 | Japan . |
|---|---|---|
| 8-97269 | 4/1996 | Japan . |

*Primary Examiner*—Patrick Assouad
*Attorney, Agent, or Firm*—Oblon, Spivak, McClelland, Maier & Neustadt, P.C.

[57] ABSTRACT

In an arm access position sensing method according to the present invention, optical sensors are provided in a cassette chamber. An adjusting cassette holding wafers W in the top slot and bottom slot is placed on a stage in the cassette chamber. The stage is movable. In a calibration process, the reference slot position, map position, and map thickness are calculated using optical sensors. Similarly, in a mapping process, the sampling thickness and map wafer offset value of each slot in the cassette holding the wafers W are calculated. In an arm access position sensing process, the access position of the transfer arm is calculated using the sampling thickness, map wafer offset value, reference slot position, map position, map thickness, and specific values. On the basis of the access position, the transfer arm and stage are actuated to transfer the wafer W.

19 Claims, 14 Drawing Sheets

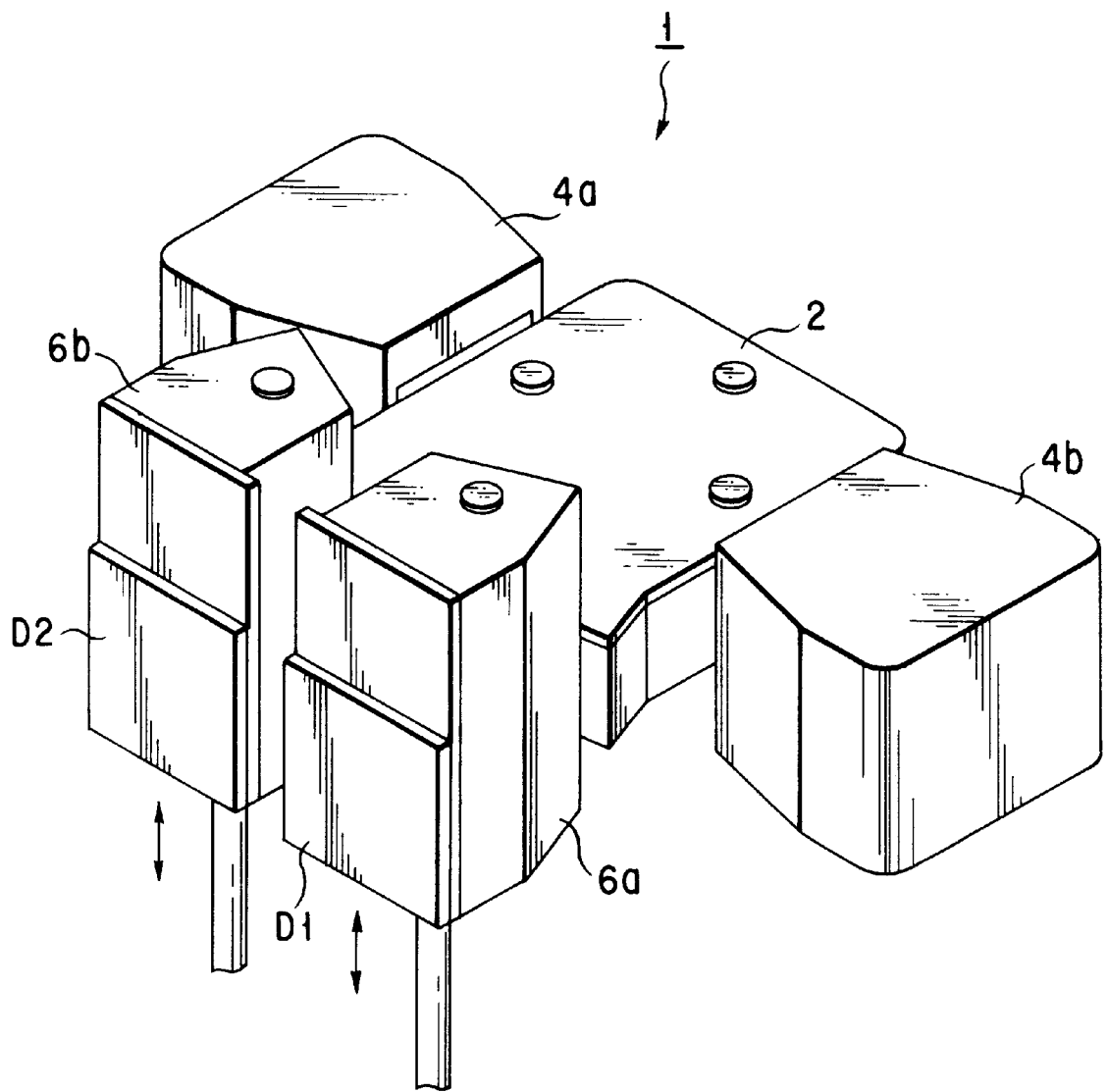
F I G. 1

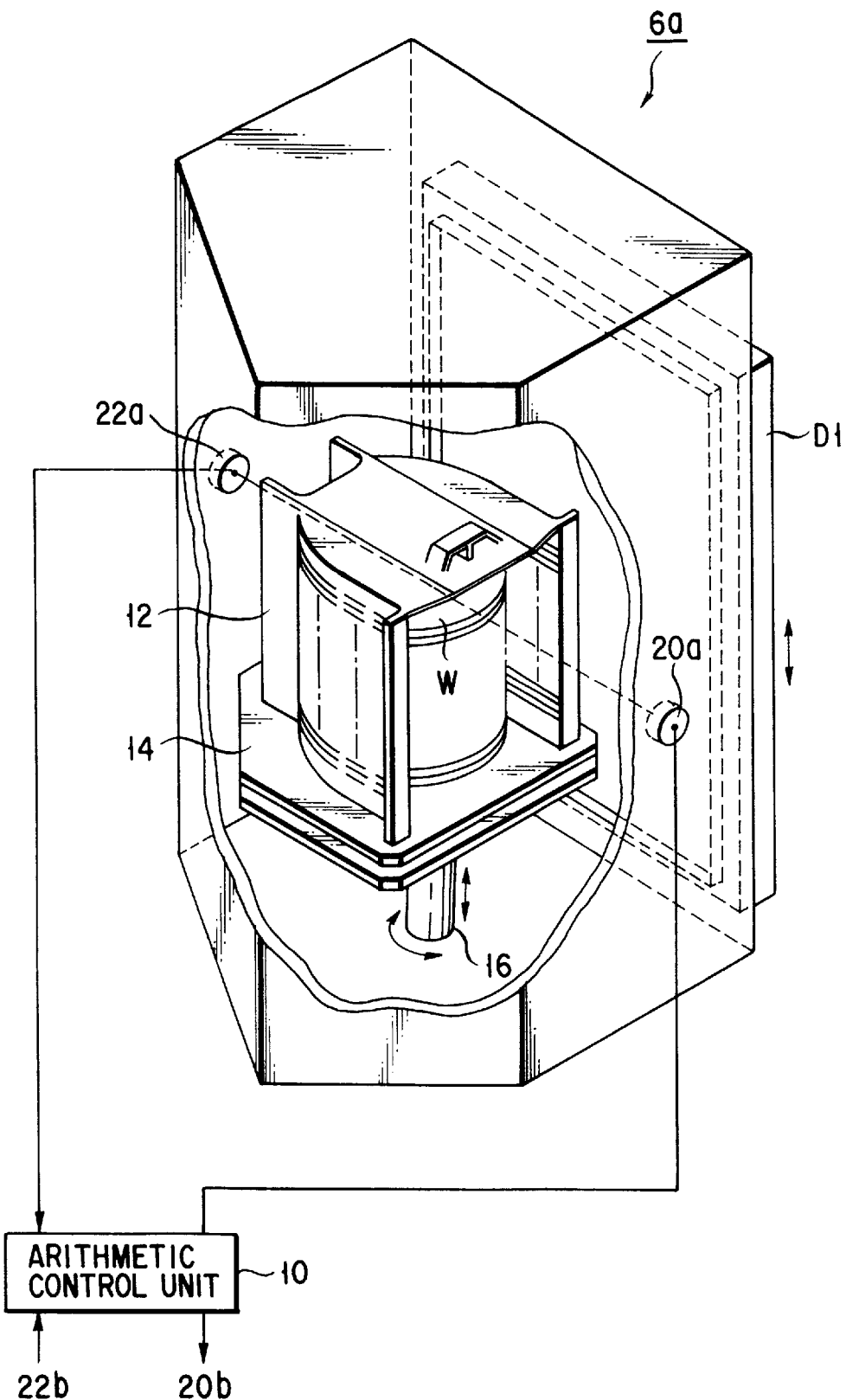
F I G. 3

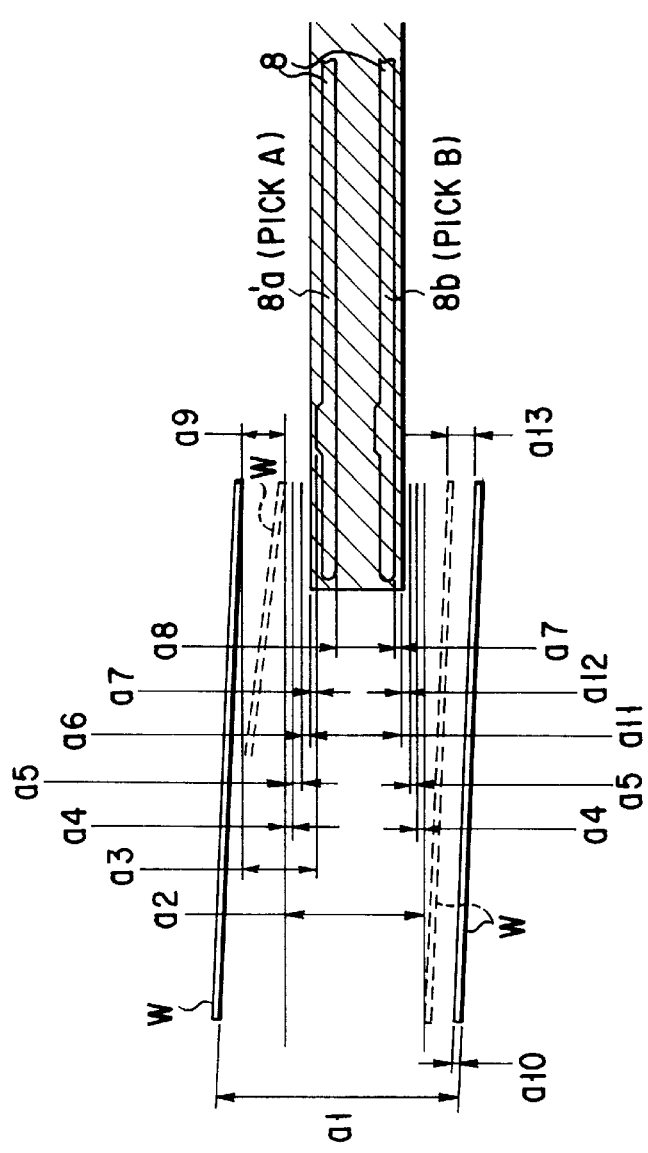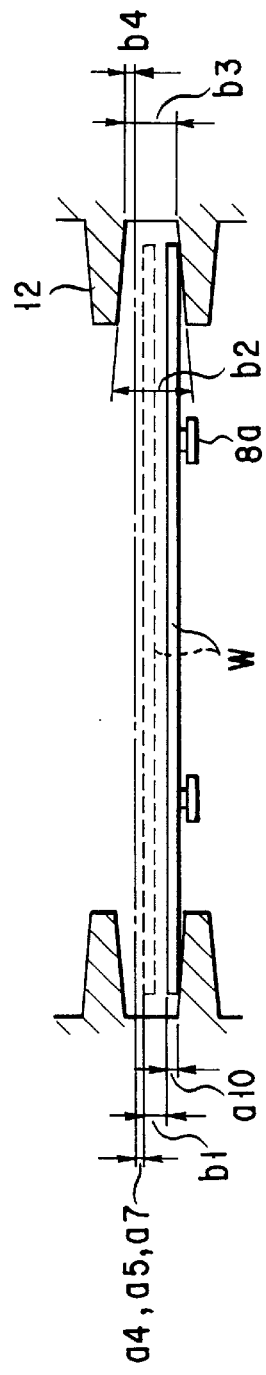
F I G. 4
F I G. 5

METHOD OF SENSING ACCESS POSITIONS OF ARM

BACKGROUND OF THE INVENTION

The present invention relates to a method of sensing access positions of the arm of a transfer mechanism in a semiconductor equipment system.

In recent semiconductor device processes, sheet semiconductor equipment systems of the multi-chamber type with a systematically clustered tool structure have been used. In this type of system, various process chambers for deposition processes, such as sputtering, or CVD, and etching processes, such as RIE, and load/unload chambers for externally loading and unloading an object to be processed are arranged around a transfer chamber with a transfer mechanism. These chambers are connected to the transfer chamber through gates.

In the semiconductor equipment system, a cassette that holds more than one object to be processed, for example, a silicon wafer (hereinafter, referred to as a wafer), is first placed on a stage that can be moved in the load/unload chamber.

Then, a wafer is taken out of the cassette by the transfer arm of a transfer mechanism provided in the transfer chamber and conveyed into a specified process chamber via the transfer chamber.

The wafer conveyed into the process chamber is subjected to specific processes including an etching process, a sputtering process, and a CVD process. After the specific processes, the wafer is conveyed through the transfer chamber and housed in the cassette again.

The cassette has slots in each of the side walls facing each other, each slot for one wafer, and can house wafers, for example 25 wafers, in parallel.

In general, when a wafer is loaded and unloaded into and from the cassette in the load/unload chamber through the transfer chamber, the access position of the transfer arm has to be adjusted beforehand so that each slot in the cassette can be accessed. Using, for example, an optical sensor provided in the load/unload chamber, the following four access positions of the transfer arm are found for each cassette with respect to a pick formed on the transfer side of the transfer arm:

(1) Access position when the bottom slot has no wafer (2) Access position when the bottom slot has a wafer (3) Access position when the top slot has no wafer (4) Access position when the top slot has a wafer Information on these positions is stored in a specific memory device.

Then, a cassette stage on which the cassette has been placed in the load/unload chamber and the transfer arm operate on the basis of information on the access positions, thereby transferring the wafer in the desired state.

To determine the four access positions for each cassette with respect to the pick of the transfer arm, however, the operator must be skillful in the work because a method of sensing and setting the positions is very complex.

Moreover, in the method, the direction in which the light beam is projected, that is, the parallelism of the light beam, has to be adjusted for each slot in each cassette before the sensing. Therefore, it takes time to start to sense the access positions, which results in a decrease in the throughput.

Furthermore, when the parallelism of the light beam has collapsed at only one of the slots, this prevents the access position on the cassette from being sensed.

In addition, in the method of sensing the access position of the transfer arm, it is very difficult to sense cross slots. In cross slots, a wafer is housed obliquely in two slots. In the place where cross slots are present, there is a strong possibility that the advance of the transfer arm will damage the wafer.

Furthermore, after the cassette has been used for a long time, strains take place in the cassette, which causes the following problem: the position in which the wafer is placed is shifted from the proper position gradually. As a result, the wafer cannot be placed in the proper position, making it difficult to calculate the access position of the transfer arm. This may lead to an increase in the number of errors in the transfer of the wafer.

In a case where a wafer on which an orientation flat section has been formed is used, the weight balance of the wafer differs, depending on whether or not the orientation flat section is present. When the wafer is housed in such a manner that the orientation flat section aligns with the back of the cassette, the front of the wafer may hang down. As a result, the advance of the transfer arm can damage the wafer. The droop of the wafer's front can permit the transfer arm to bump against the wafer, which will possibly prevent the arm from advancing between the slots, making it impossible to transfer the wafer.

BRIEF SUMMARY OF THE INVENTION

The object of the present invention is to provide an improved arm access position sensing method which easily senses and sets access positions of a transfer arm and reliably senses transfer errors, such as cross slots, preventing damage to wafers, and which is capable of calculating the optimum access position and improving the transfer efficiency, even when a distorted cassette or a wafer on which an orientation flat section has been formed is used.

The foregoing object is accomplished by providing a method of sensing an access position of an arm that loads or unloads a wafer into or from a wafer cassette with slots for housing wafers, the arm access position sensing method comprising: a calibration step of putting at least two reference wafers in the top and bottom reference slots, optically sensing the positions of these reference wafers, and calculating an offset value inherent to a reference wafer cassette; a mapping step of optically sampling a processing wafer cassette and sensing the presence or absence of a wafer in each slot and information on an apparent thickness (sampling thickness) of the wafer in each of the slots; and the step of calculating an access position of the arm by correcting the sampling thickness on the basis of the offset value.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic perspective view of a vacuum processing system to which the present invention is applicable;

FIG. 3 is a schematic perspective view of the load/unload chamber in the vacuum processing system of FIG. 1;

FIG. 4 is a diagram to help explain various definitions related to an embodiment of the present invention;

FIG. 5 is a diagram to help explain various definitions related to the embodiment;

DETAILED DESCRIPTION OF THE INVENTION

Hereinafter, referring to the accompanying drawings, an embodiment of the present invention will be explained in detail.

Figure 2:
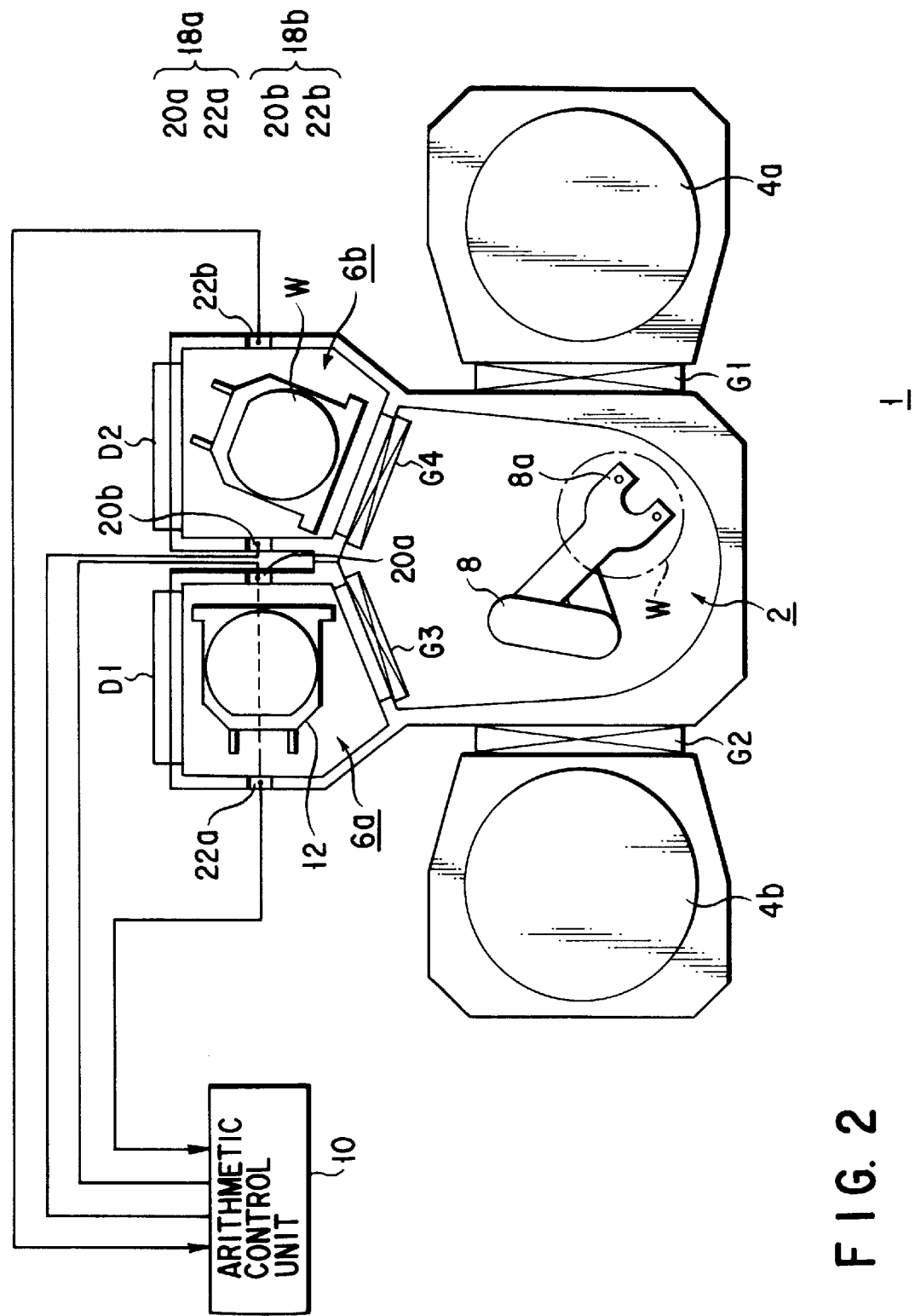
FIG. 2 is a schematic plan view of the vacuum processing system of FIG. 1.

Referring to FIG. 1 to FIG. 3, an embodiment will be explained where an arm access position sensing method according to the present invention has been applied to a multi-chamber equipment system with a clustered tool structure.

In the explanation below, component parts having almost the same functions and structures will be indicated by the same reference symbols. Explanation of them will be omitted.

FIG. 1 shows a semiconductor equipment system 1. In the semiconductor equipment system 1, for example, two process chambers 4a, 4b and two load/unload chambers 6a, 6b are arranged around a transfer chamber 2 with a transfer mechanism. As shown FIG. 2, the process chambers 4a, 4b and load/unload chambers 6a, 6b are connected to the transfer chamber 2 via gate valves G1, G2, G3, and G4, respectively.

In the transfer chamber 2, a transfer arm 8 composed of, for example, a multi-axis articulated arm is provided. The transfer arm 8 is positioned so that it can transfer an object to be processed, for example, a wafer W, between the transfer chamber 2 and the load/unload chambers 6a, 6b or the process chambers 4a, 4b.

On the transfer side of the transfer arm 8, a specific pick 8a for holding the back of the wafer W is formed. A driving mechanism (now shown) is connected to the transfer arm 8. A arithmetic control unit 10 shown in FIGS. 2 and 3 is connected to the driving mechanism.

The process chambers 4a, 4b are an aggregate of machines for subjecting the treatment surface of the wafer W to specific processes consecutively. For example, they are composed of an etching machine and a sputtering machine.

The load/unload chambers 6a, 6b are designed to enable a cassette 12 to be loaded or placed therein as shown in FIGS. 2 and 3. The cassette 12 is capable of housing, for example, 25 wafers W at a time. The load/unload chambers 6a, 6b are provided with door valves D1 D2, respectively, on the transfer path side of the cassette 12, as shown in FIGS. 1 and 2. Specifically, the load/unload chambers 6a, 6b are hermetically sealed from the outside world.

In the load/unload chambers 6a, 6b, a stage 14 on which the cassette 12 is placed is provided in such a manner that it can move up and down and rotate freely as shown in FIG. 3. The stage 14 is connected via a support member 16 to a driving mechanism (not shown) provided outside the load/unload chambers 6a, 6b. The arithmetic control unit 10 is connected to the driving mechanism as shown in FIGS. 2 and 3. Accordingly, the cassette 12 placed on the stage 14 moves up and down and rotates freely under the control of the arithmetic control unit 10, thereby being located in the desired position.

Optical sensors 18a, 18b are provided on, for example, the inner walls of the load/unload chambers 6a, 6b. The optical sensors 18a, 18b are composed of light-emitting sections 20a, 20b, and light-receiving sections 22a, 22b. The light-emitting sections 20a, 20b and light-receiving sections 22a, 22b are provided in almost the same plane as that of the transfer side of the transfer arm 8 in such a manner that the former face the latter and that the former can transmit specific light to the latter.

The optical sensors 18a, 18b are connected to the arithmetic control unit 10 and transmit to the unit 10 information on the presence or absence of light transmission between the light-emitting sections 20a, 20b and the light-receiving sections 22a, 22b.

Next, an arm access position sensing method according to the present embodiment will be explained. To make it easier to understand the embodiment, terms used in the present specification will be described.

(1) Actual wafer thickness: the actual thickness of a wafer W (a10 in FIG. 4)

(2) Allowed limit value: the allowed value of the deviation of the central position of each wafer W from a reference slot position in the mapping process (a2 in FIG. 4)

Figure 16:
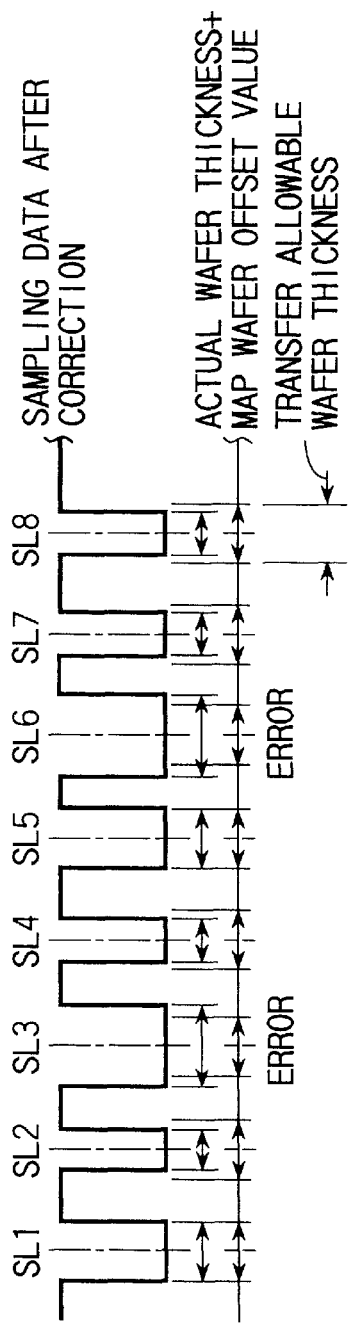
FIG. 16 is a schematic diagram to help explain the mapping process related to the embodiment.

(3) Slot pitch allowed value: the minimum allowed value of the distance between slots (4) Transfer allowable wafer thickness: the allowed value of actual wafer thickness (FIG. 16)

(5) Up offset value: a correction value for up-and-down movement (in the direction of the indexer Z-axis) of the stage 14 when the transfer arm 8 unloads the wafer W from the cassette 12 (a3 in FIG. 4)

(6) Down offset value: a correction value for the indexer Z-axis when the wafer W on the transfer arm 8 is loaded into the cassette 12 (b1 in FIG. 5)

(7) Empty cassette offset value: a correction value for the up position, explained later, when there is no wafer W in the mapping process (8) Base position: the indexer Z-axis position in which the transfer arm 8 comes into contact with the back of the wafer W in the bottom slot (c3 in FIG. 7A)

(9) Map position: the central position of the wafer W in the bottom slot determined in the calibration process

Figure 11A:
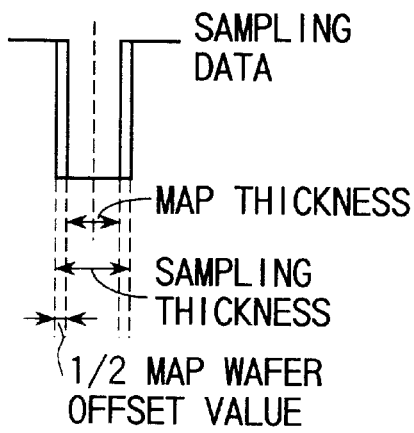
FIG. 11A is a schematic diagram to help explain the calibration process related to the embodiment.
Figure 11B:
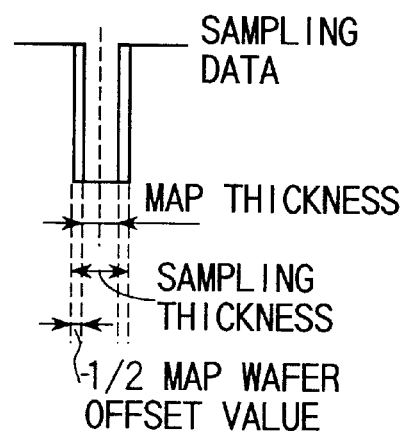
FIG. 11B is a schematic diagram to help explain the calibration process related to the embodiment.

(10) Map thickness: an apparent thickness of the wafer W in the bottom slot determined in the calibration process (FIGS. 11A, 11B)

(11) Reference slot position: the central position of each slot determined in the calibration process

(12) Sampling thickness: an apparent thickness of the wafer W sensed during sampling (FIGS. 11A, 11B)

(13) Map wafer offset value: the difference between an apparent thickness of the wafer W during the mapping of each slot and the map thickness determined in the calibration process

(14) Up position: the position of the indexer Z-axis of each slot when the transfer arm 8 unloads the wafer W from the cassette 12

(15) Down position: the position of the indexer Z-axis of each slot when the transfer arm 8 loads the wafer W into the cassette 12

In FIG. 4, various set values for the transfer arm 8 and cassette 12 in the specification are as follows:

a1—the pitch distance
a2—the maximum insertion area for the transfer arm 8 (pick)
a3—the up offset value
a4—the mapping accuracy
a5—the accuracy of the up-and-down movement of the stage 14
a6—the amount of upper clearance
a7—the amount of vibration clearance
a8—the difference in height between pick A8a' and pick B8a"
a9—the maximum amount of the front droop
a10—the thickness of an actual-wafer
a11—the area excluding the transfer arm 8 (pick)
a12—the amount of lower clearance
a13—the maximum pick error In FIG. 5, various set values for the transfer arm 8 and cassette 12 in the specification are as follows:

b1—the down offset value
b2—the slot taper angle
b3—the slot groove area
b4—the amount of slot clearance Next, an arm access position sensing method according to the embodiment will be explained.

The arm access position sensing method is composed of (A) the process of adjusting various members, (B) a calibration process, and (C) a mapping process and an arm access position sensing process, as described later.

First, in the process of adjusting various members, a cassette (an adjusting cassette 12a is assumed to be used in the embodiment) and the stage 14 in the load/unload chambers 6a, 6b are adjusted.

Then, in the calibration process, an offset value inherent to the adjusting cassette 12a is determined using the adjusted members. Once the adjusting process and the calibration process have been performed, they need not be performed each time a cassette is loaded into the load/unload chambers 6a, 6b.

When a wafer W is conveyed for processing, each of the following processes are supposed to be performed for each cassette 12. First, in the mapping process, the cassette 12 on which the wafers W have been housed and the present state of the wafers W are sensed.

Then, the arm access position sensing process is performed. In the arm access position sensing process, the value found in the mapping process is corrected on the basis of the inherent value of each member and the value found in the calibration process and an access position of the transfer arm 8 is sensed.

Then, on the basis of the value determined in the arm access position sensing process, the transfer arm 8 and stage 14 are operated.

Next, each of (A) the process of adjusting various members, (B) the calibration process, and (C) the mapping process and the arm access position sensing process will be explained in detail.

(A) The process of adjusting various members

The process of adjusting various member is performed before the calibration process. The adjusting process is an important process for sensing the state of the adjusting cassette 12a in the calibration process or the cassette 12 in the mapping process exactly and reliably. The adjusting process is composed of [1] the process of adjusting the parallelism of the transfer arm 8, [2] the process of adjusting the stage 14, [3] the process of confirming the reliability of the adjusting cassette 12a, and [4] the process of teaching values related to the operation of the transfer arm 8 and the movement of the indexer Z-axis.

The word "teaching" is used here to mean the setting, storing or designating values and data items.

Hereinafter, these processes will be explained in detail.

[1] The process of adjusting the parallelism of the transfer arm 8 will be described.

The process of adjusting the parallelism of the transfer arm 8 is the process of bringing the parallelism of the pick 8a on the transfer side of the transfer arm 8 shown in FIG. 2 into a specific state. The process is carried out to cause the transfer arm 8 to access the cassette 12 or the adjusting cassette 12a in a desired state. Then, a wafer W is put on the pick 8a of the transfer arm 8 and the transfer arm 8 is adjusted so that the back of the wafer W may be almost in parallel with, for example, the inner bottom surface of the transfer chamber 2 in a horizontal plane, with a specific distance between them.

[2] The process of adjusting the stage 14 will be described.

The process of adjusting the stage 14 is performed to locate the cassette 12 or the adjusting cassette 12a in a desired position on the stage 14.

In the process, the stage 14 shown in FIG. 3 is adjusted so that the mounting surface of the stage may be located in a horizontal plane.

Accordingly, the cassette 12 or the adjusting cassette 12a on the stage 14 is located in a horizontal plane. In a case where a wafer W on which, for example, an orientation flat section or a notch section has been formed is used, when the cassette 12 housing the wafer W is placed on the stage 14, what is called a front droop may occur in the wafer.

In this case, it is possible to tilt the stage 14 at a specific angle to compensate for the front droop in the wafer W inside the cassette.

[3] The process of confirming the reliability of the adjusting cassette 12a will be described.

In the calibration process, various conditions are set using the adjusting cassette 12a as a reference, in place of the cassette 12. Consequently, the reliability of the adjusting cassette 12 is a very important parameter. The reliability of the adjusting cassette 12 is determined as follows.

Figure 6A:
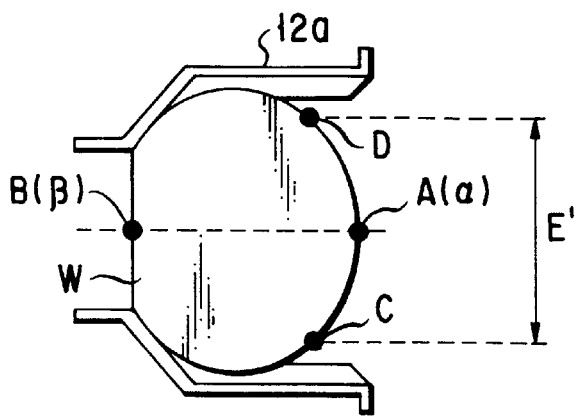
FIG. 6A is a schematic top view of the adjusting cassette related to the embodiment to help explain how to confirm the reliability of the adjusting cassette.
Figure 6B:
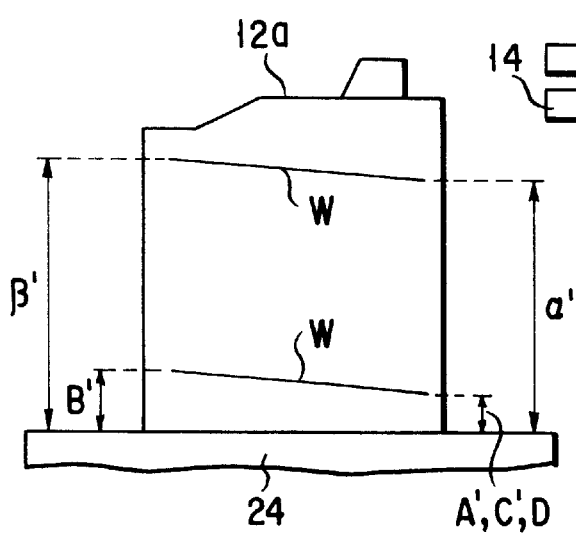
FIG. 6B is a schematic side view of the adjusting cassette related to the embodiment to help explain how to confirm the reliability of the adjusting cassette.

First, wafers W are inserted into the top slot and bottom slot formed in the adjusting cassette 12a, as shown in FIGS. 6A and 6B.

Next, wafers W are put in the remaining slots in such a manner that the orientation flat section of each wafer W is located at the back of the adjusting cassette 12a.

Then, after the adjusting cassette 12a has been placed on a fixed plate 24, the following distances are measured:

A'—the distance between the top surface of the fixed plate 24 and point A on the back of the wafer W in the bottom slot on the opening side of the adjusting cassette 12a B'—the distance between the top surface of the fixed plate 24 and point B on the back and on the orientation flat side of the wafer W in the bottom slot C'—the distance between the top surface of the fixed plate 24 and point C set in an almost symmetrical position with respect to the line connecting point A to point B on the back of the wafer W in the bottom slot on the load/unload side of the adjusting cassette 12a D'—the distance between the top surface of the fixed plate 24 and point D set in an almost symmetrical position with respect to the line connecting point A to point B on the back of the wafer W in the bottom slot E'—the distance between point C and point D on the wafer W in the bottom slot α'—the distance between the top surface of the fixed plate 24 and point α on the wafer W in the top slot corresponding to point A on the wafer W in the bottom slot β'—the distance between the top surface of the fixed plate 24 and point β on the wafer W in the top slot corresponding to point B on the wafer W in the bottom slot.

Then, on the basis of these measurements, a check is made to see if A', B', C', D', E', (A'−B'), and (C'−D') of the bottom slot, α' and β' of the top slot, and $\{(\alpha'+\beta')-(A'+B')\}/2$ of the pitch distance fulfill specific reference values or lie within specific allowed ranges. Only a cassette fulfilling those conditions is used as the adjusting cassette 12a.

[4] The process of teaching the values related to the operation of the transfer arm 8 and the movement of the indexer Z-axis will be described.

The teaching process is the process of causing the arithmetic control unit 10 to store the values related to the operation of the transfer arm 8 and the movement of the indexer Z-axis (the up-and-down movement of the stage 14). The teaching is done as follows, using the adjusting cassette 12a meeting the above conditions.

Figure 7A:
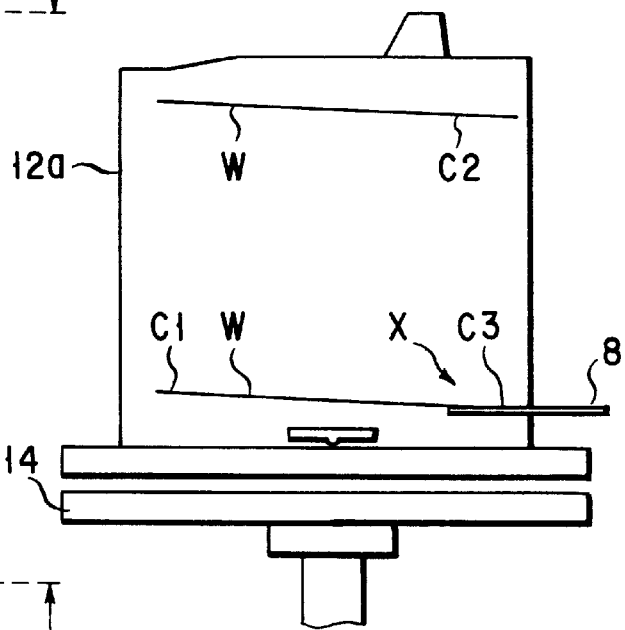
FIG. 7A is a schematic side view to help explain the teaching of the operation of the transfer arm and indexer Z-axis according to the embodiment.
Figure 7B:
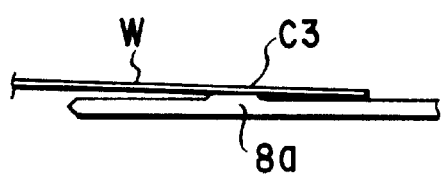
FIG. 7B is a schematic view to help explain the teaching of the operation of the transfer arm and indexer Z-axis according to the embodiment.

In FIGS. 7A and 7B, the reference symbols are:

—c1—the orientation flat section c2—front drooping c3—the base position

Figure 8:
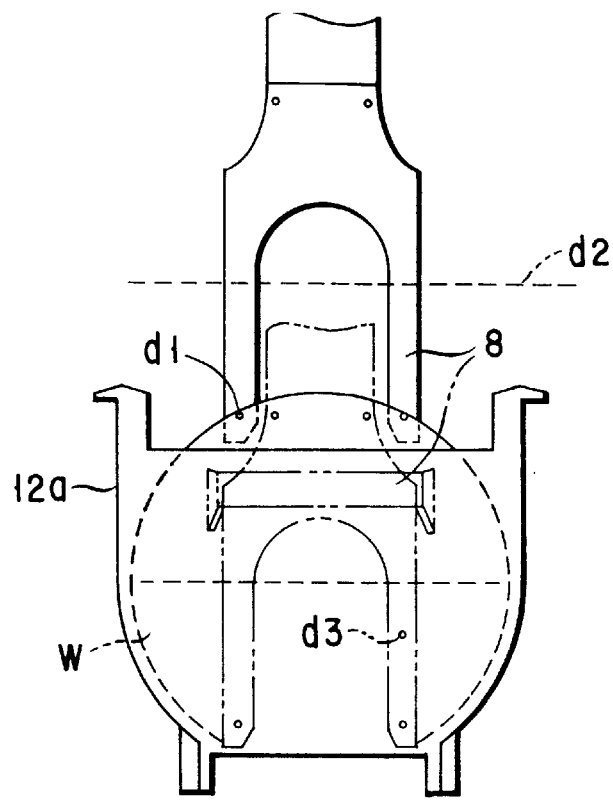
FIG. 8 is a schematic view to help explain the teaching of the operation of the transfer arm and indexer Z-axis according to the embodiment.

In FIG. 8, the reference symbols are:

d1—the teaching position of the base position d2—the position of the transfer arm 8 moved a specific distance toward the transfer chamber 2 d3—the teaching coordinates of the wafer W inserted into the bottom slot (a) First, wafers W are inserted into the top slot and bottom slot in the adjusting cassette 12a shown in FIG. 7A and are positioned so that their orientation flat sections may come into contact with the back of the adjusting cassette 12a.

(b) Next, the adjusting cassette 12a housing the wafers W is put on the stage 14.

(c) Then, as shown in FIG. 8, the arithmetic control unit 10 is caused to store the position of the transfer arm 8 that has been moved from the normal unloading position of the wafer W in the bottom slot a specific distance toward the transfer chamber 2 side, that is, the position at which the back of the wafer W in the bottom slot first comes into contact with the pick 8a of the transfer arm 8. At this time, the arrangement of the transfer arm 8 is set on the basis of the teaching coordinates of the wafer W in the bottom slot set according to the size of the wafer W.

(d) Then, the stored position makes the base position as shown in FIG. 7B which is an enlarged view of portion X in FIG. 7A.

(e) Next, the stage 14 is moved up and down slightly (in the direction of the indexer Z-axis) to check to see if the difference in height between the right and left sides of the pick 8a is within a specific range, when the pick is a single pick.

(f) When the pick is a twin pick (one in the upper part is assumed to be pick A8a' and the other in the lower part is assumed to be pick B8a"), the difference in height between the right and left sides of each of picks A8a' and B8a' is checked. In addition, as shown in FIGS. 9A and 9B, a check is made to see if pick A8a' and pick B8" and the difference in height between pick A8a' and pick B8a" are within specific ranges.

Figure 9A:
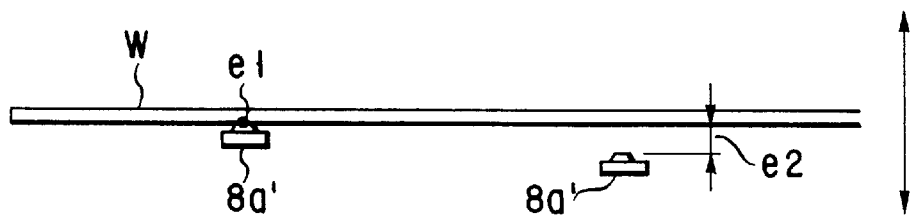
FIG. 9A is a schematic view to help explain the teaching of the operation of the transfer arm and indexer Z-axis according to the embodiment.
Figure 9B:
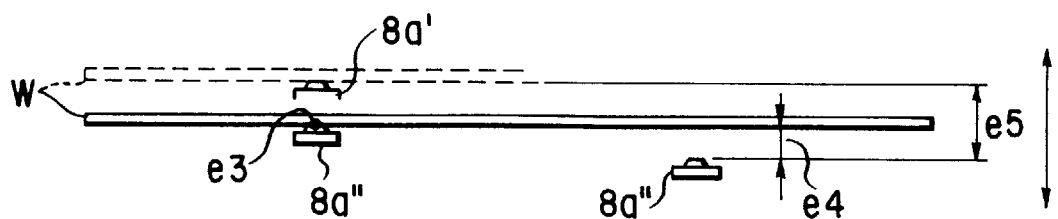
FIG. 9B is a schematic view to help explain the teaching of the operation of the transfer arm and indexer Z-axis according to the embodiment.

In FIGS. 9A and 9B, the reference symbols indicate:

e1—the base position of pick A8a' e2—the difference in height of pick A8a' e3—the base position of pick B8a"

e4—the difference in height of pick A8a"

(B) The calibration process will be described.

The calibration process is the process of calculating the inherent value of the adjusting cassette 12a. To find the value, the calibration process is composed of [1] the process of teaching a mapping start position and [2] the process of calculating a reference slot position. [1] The process of teaching a mapping start position will be explained.

The teaching process is the process of finding the positions at which the mapping beams from the light-emitting sections 20a, 20b reach the light-receiving sections 22a, 22b in the top slot, which is the mapping start position.

The positions are found as follows.

(a) First, an adjusting cassette 12a where a wafer W has been placed in the top slot is placed on the stage 14 in each of the load/unload chambers 6a, 6b.

(b) Then, the stage 14 is turned so that the wafer W loading/unloading side of the adjusting cassette 12a may face the light-emitting sections 20a, 20b of the optical sensors 18a, 18b and the orientation flat section side (back) of the adjusting cassette 12a may face the light-receiving sections 22a, 22b (hereinafter, the position is referred to as the measurement position).

(c) Next, the stage 14 is moved along the indexer Z-axis and the arithmetic control unit 10 is caused to store the positions at which the mapping beams generated from the light-emitting sections 20a, 20b reach the light-receiving sections 22a, 22b.

[2] The process of calculating the reference slot position will be explained. The calculating process is the process of finding a reference slot position used as a reference when the aforementioned cross slot has occurred or when a wafer W is loaded into an empty slot.

A method of determining the reference slot position will be described by reference to a flowchart in FIG. 10.

First, the adjusting cassette 12a where wafers W have been put in the top and bottom slots is placed on the stage 14. After the adjusting cassette 12a has been located in the measurement position as described above, the projection of a mapping beam is started.

Then, the stage 14 is moved upward and mapping data is sampled, starting from the top slot (SL1) to the bottom slot (SL25) (step S1).

Figure 10A:
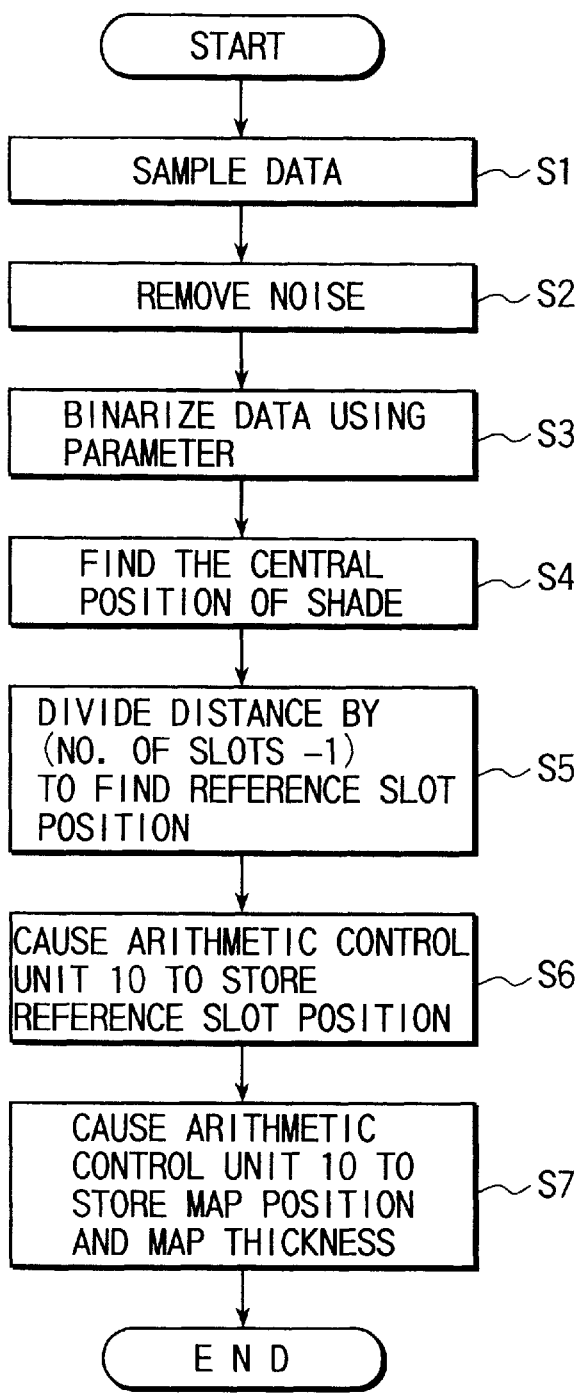
FIG. 10A is a flowchart for the calibration process related to the embodiment.

Because the sampled mapping data contains noise components as shown in FIG. 10A, the noise components are removed (step S2).

Figure 10B:
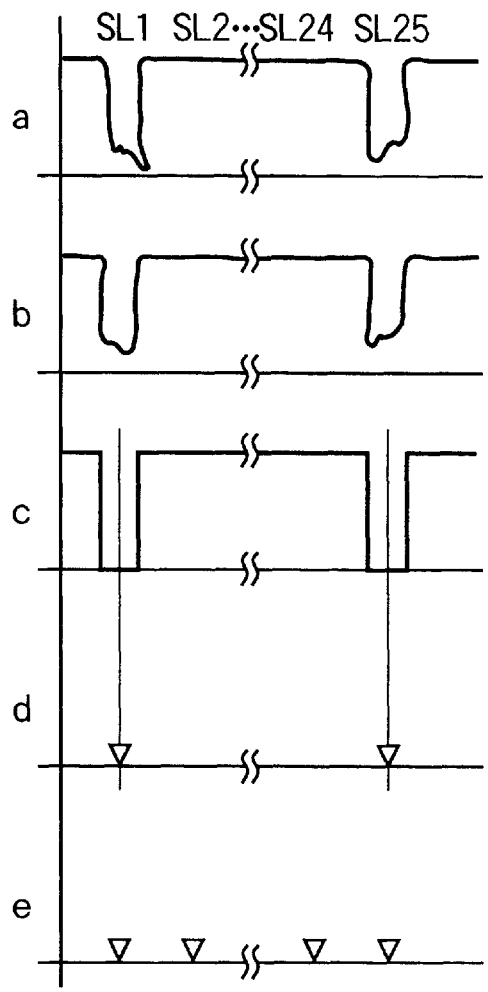
FIG. 10B is a schematic diagram to help explain the calibration process related to the embodiment.

Then, the mapping data from which the noise components have been removed as shown in FIG. 10B is binarized using a specific parameter as shown in FIG. 10B (c) (step S3).

As shown in FIG. 10B (d), the central position of each of the two shaded portions is calculated (step S4). The distance between the two central positions is divided by (the number of slots−1) to determine a reference slot position as shown in FIG. 10B (e) (step S5).

The arithmetic control unit 10 is caused to store the reference slot position (step S6). Additionally, the arithmetic control unit 10 is also caused to store the map position, the central position of the first wafer W housed in the bottom slot (SL1), and the map thickness, the apparent thickness of the first wafer W (step S7).

Then, after the arithmetic control unit 10 has stored those positions, the calibration process is completed.

The difference between the sampling thickness of each slot, the data width in binarization at step S3, and the map width of the reference wafer W is measured to determine a map offset value.

Specifically, when the sampling thickness is greater than the map thickness, the map wafer offset value is the sum of the ½ map wafer offset values on both sides of the map thickness using the reference slot position as a reference, as shown in FIG. 11A.

When the sampling thickness is smaller than the map thickness, the map wafer offset value is the value obtained by making positive the sum of the −½ map offset values on both sides of the sampling thickness using the reference slot position as a reference, as shown in FIG. 11B.

(C) The mapping process and the arm access position sensing process will be explained.

The mapping process is carried out each time a cassette 12 is loaded into each of the load/unload chambers 6a, 6b. The mapping process is the process of sensing the cassette 12 and the state of the wafers W in the cassette 12. The arm access position sensing process is the process of finding an access position of the transfer arm 8 on the basis of the inherent value of each member, the values calculated in the calibration process, and the values determined in the mapping process.

Figure 13:
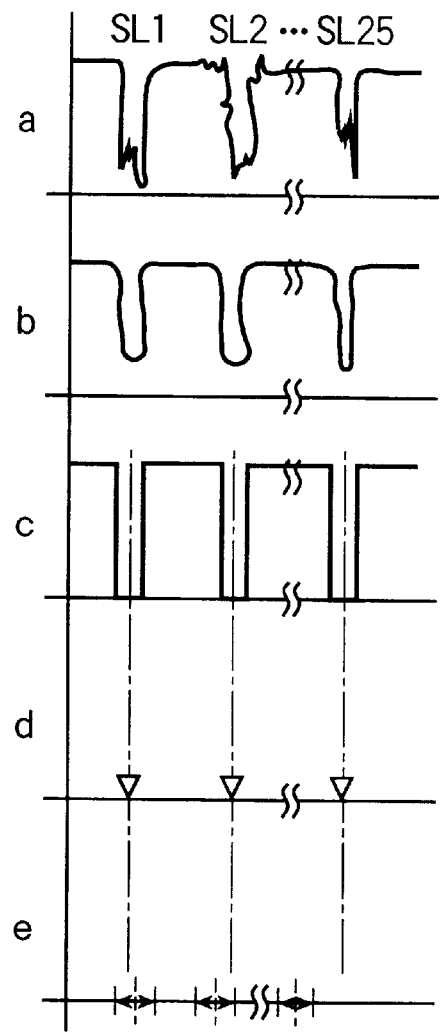
FIG. 13 is a schematic diagram to help explain the mapping process related to the embodiment.
Figure 12A:
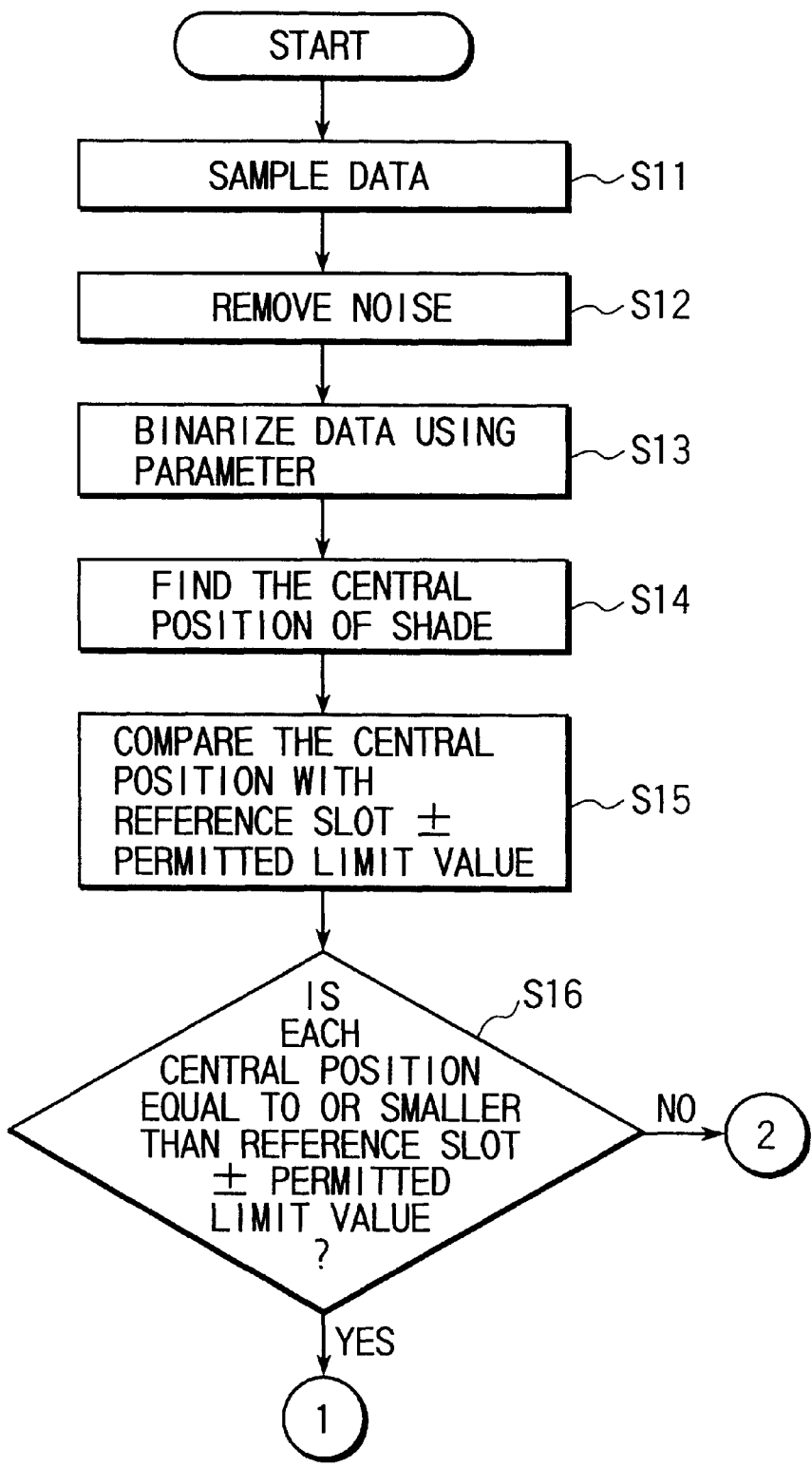
FIG. 12A is a flowchart for the mapping process related to the embodiment.
Figure 12B:
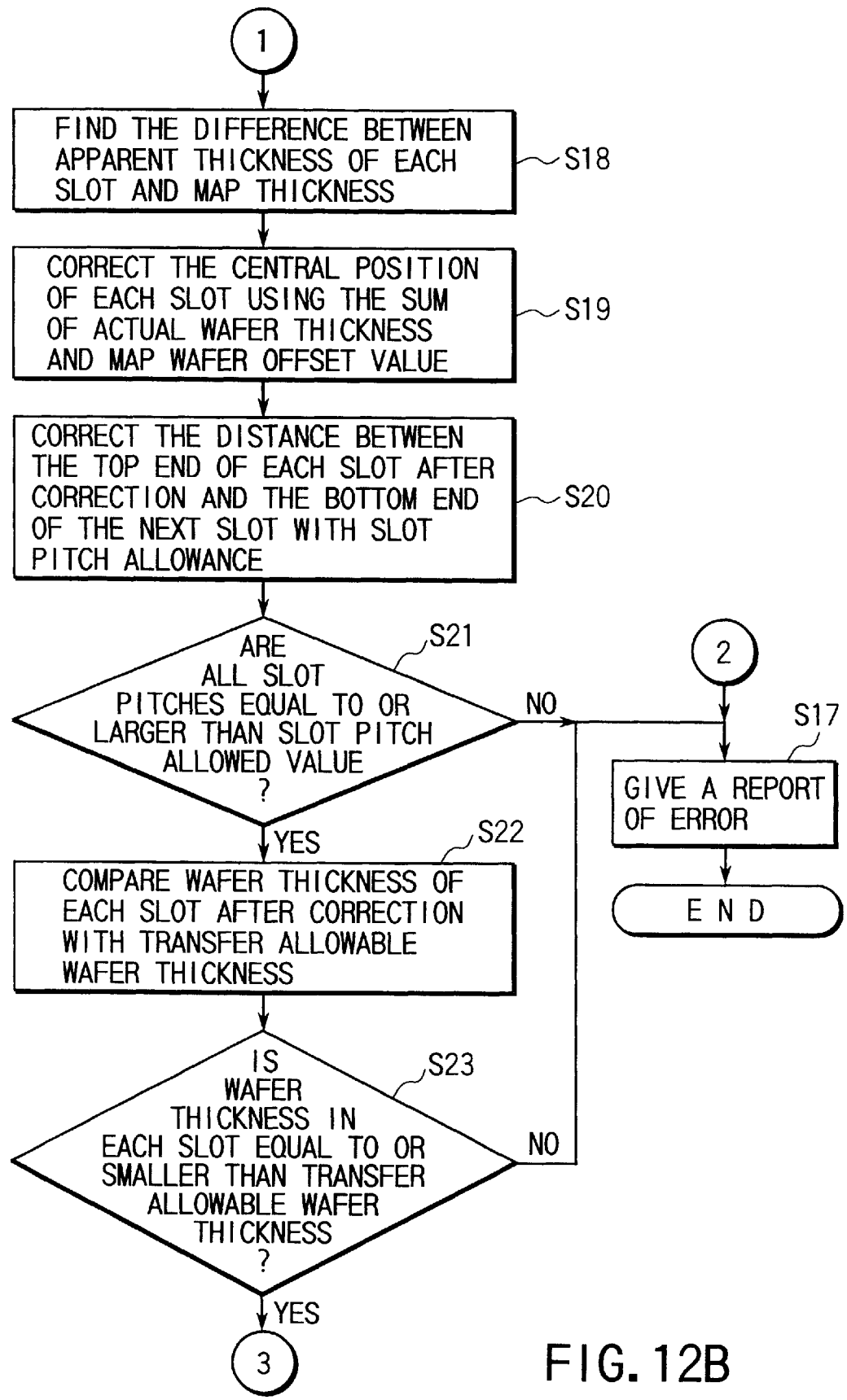
FIG. 12B is a flowchart for the mapping process following FIG. 12A.
Figure 12C:
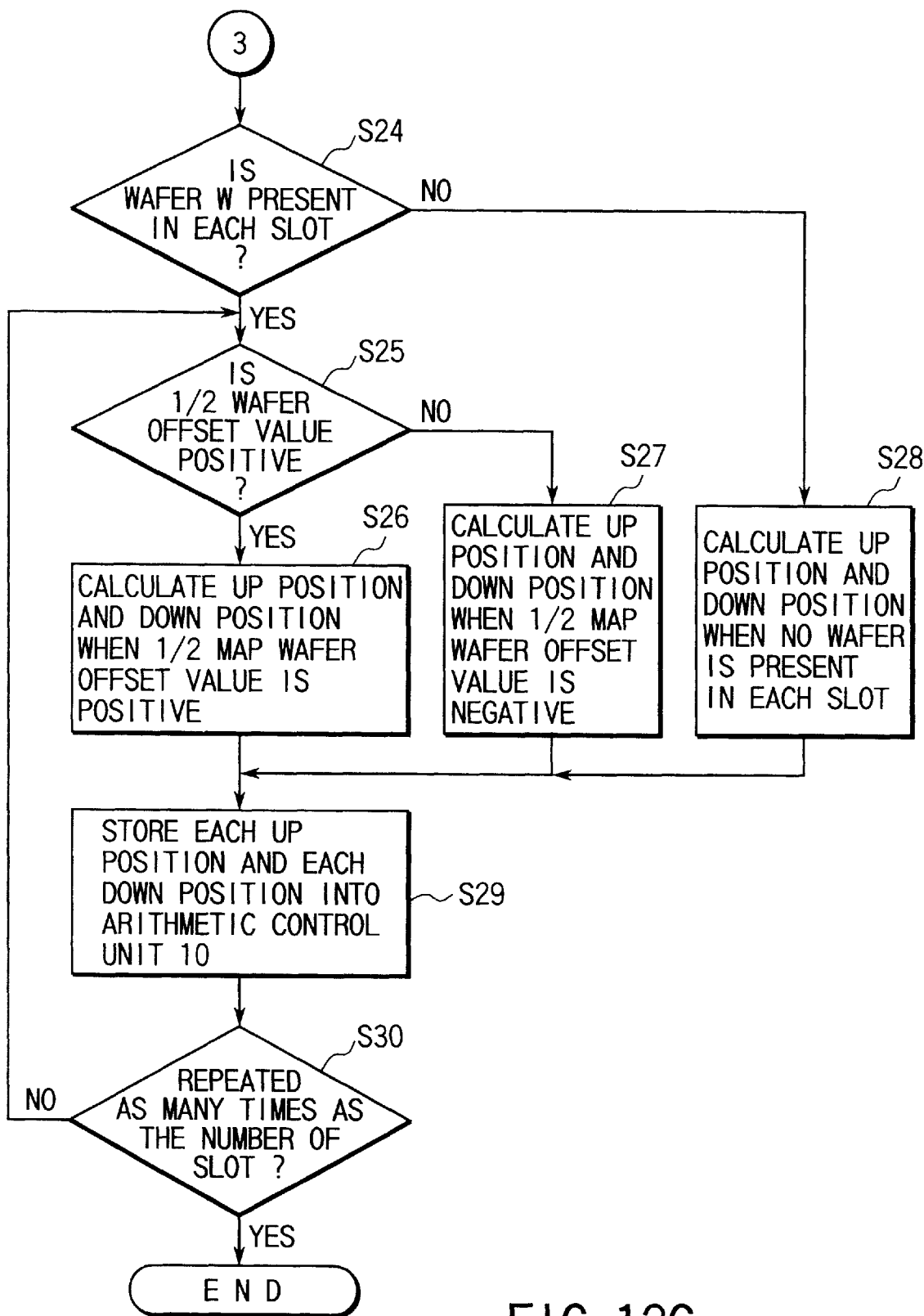
FIG. 12C is a flowchart for the mapping process following FIG. 12B.

The mapping process and the arm access position sensing process will be described by reference to the flowcharts shown in FIGS. 12A, 12B, and 12C and to FIG. 13.

After a normally used cassette 12 has been placed on the stage 14, a driving mechanism (not shown) moves the cassette 12 from the specific position upward and simultaneously the projection of a mapping beam is started. The shaded positions (mapping data) of the mapping beam are sampled, starting from the top slot (SL1) to the bottom slot (SL25), in synchronization with the encoder signal generated from an encoder (not shown) connected to the driving mechanism, as shown in FIG. 13(a) (step S11).

Next, as shown in FIG. 13(b), the noise components in the sampled mapping data are removed (step S12).

Then, the mapping data from which the noise components have been removed is binarized using a specific parameter as shown in FIG. 13(c) (step S13). As shown in FIG. 13(d), the central position of each of the shaded portions is calculated (step S14).

Then, as shown in FIG. 13(e), the central position of each shaded portion found at step S14 is compared with the reference slot position±the allowed limit value (step S15).

Figure 14:
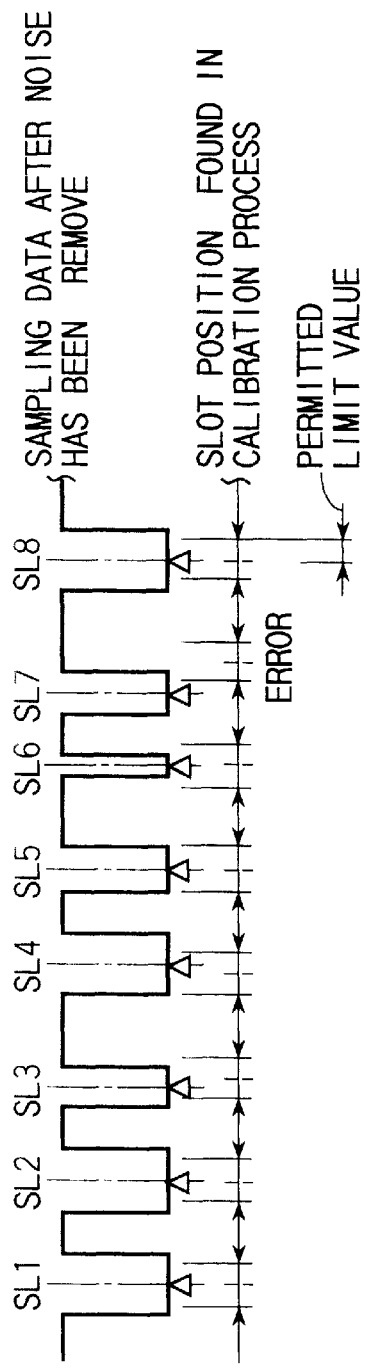
FIG. 14 is a schematic diagram to help explain the mapping process related to the embodiment.

Then, it is judged whether the central position of each shaded portion is smaller or larger than or equal to the reference slot position±the allowed limit value (step S16). If the judgment has shown that at least one central position is larger than or equal to the reference slot position±the allowed limit value (NO), for example, if a mapping error has occurred in slots SL7 and SL8 as shown in FIG. 14, the user will be informed of the mapping error (step S17). Then, the faulty cassette 12 will be ejected and the mapping process will be terminated.

The cassette distortion allowance, such as slot pitch error, is the distance from the top slot SL1 to the bottom slot SL25 in the adjusting cassette 12a±the allowed limit value.

In the case of a distorted cassette 12, when its distortion is smaller than the cassette distortion allowance, the cassette 12 can be used.

In the judgment at step S16, if each central position is smaller than the reference slot position±the allowed limit value (YES), the difference between the apparent thickness of each slot and the map thickness found in the calibration process, that is, the map wafer offset value is calculated for each slot (step S18).

The central position of each slot determined at step S14 is corrected using the sum of the actual wafer thickness, or the actual thickness of the wafer W, and the absolute value of each map wafer offset value. That is, the wafer thickness in each slot is corrected (step S19).

Next, the distance between the upper end of a slot after correction and the lower end of the next slot, that is, the distance between the bottom surface of the wafer W in slot SL1 and the top surface of the wafer W in the slot just below the slot SL1 (slot pitch), is compared with the slot pitch allowance (step S20).

In the comparison, it is judged whether or not the slot pitch of each slot is equal to or larger than the slot pitch allowance (step S21). It is assumed that a slot pitch error is not judged at the bottom slot SL25. It is also assumed that a slot pitch error is not judged at slot SL1 even when a wafer W is not housed in another slot.

Figure 15:
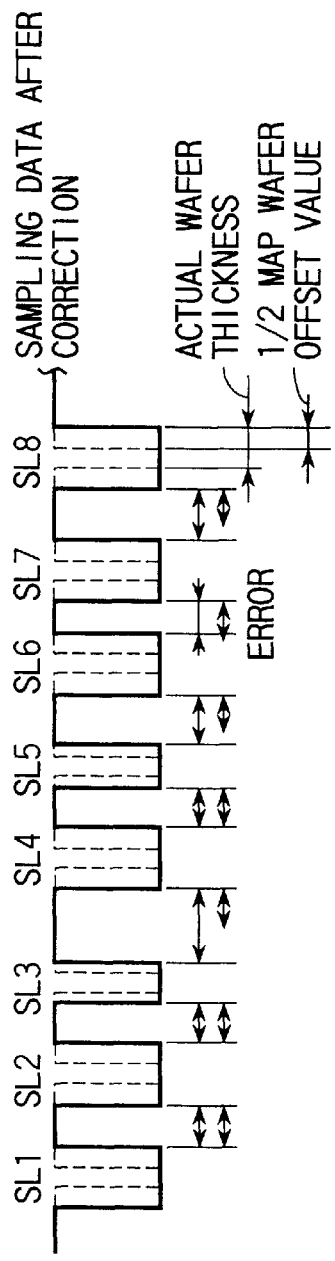
FIG. 15 is a schematic diagram to help explain the mapping process related to the embodiment.

Then, if the judgment at step S21 has shown that the slot pitch of slot SL1 is not equal to or larger than the slot pitch allowance (NO), for example, if a slot pitch error has occurred in slots SL6 and SL7 as shown in FIG. 15, the user will be informed of the mapping error, as at step S214 (step S17). Then, the faulty cassette 12 will be ejected and the mapping process will be terminated.

If the judgment at step S21 has shown that each slot pitch is equal to or larger than the slot pitch allowance (YES), the wafer thickness in each slot after correction will be compared with the transfer allowable wafer thickness (step S22).

Then, it is judged whether or not the wafer thickness in each slot is smaller than the transfer allowable wafer thickness (step S23). If the judgment has shown that the wafer thickness in slot SL1 is equal to or larger than the transfer allowable wafer thickness (NO), for example, if it is as shown in SL3 or SL6 of FIG. 16, the thickness will be judged to be a thickness error in a slot and control will proceed to step S17. Then, the user will be informed of the mapping error, followed by the ejection of the faulty cassette 12 and the termination of the mapping process.

If the judgment at step S23 has shown that the wafer thickness in each slot is smaller than the transfer allowable wafer thickness (YES), the arm access position process is performed on each of the slots in the cassette 12, following the mapping process until step S23. A check is made to see if a wafer W has been housed in each slot of the cassette 12 (step S24).

If the check has shown that a wafer W has been housed in each slot (YES), it will be judged whether or not the aforementioned ½ map wafer offset value is positive (step S25).

Figure 17:
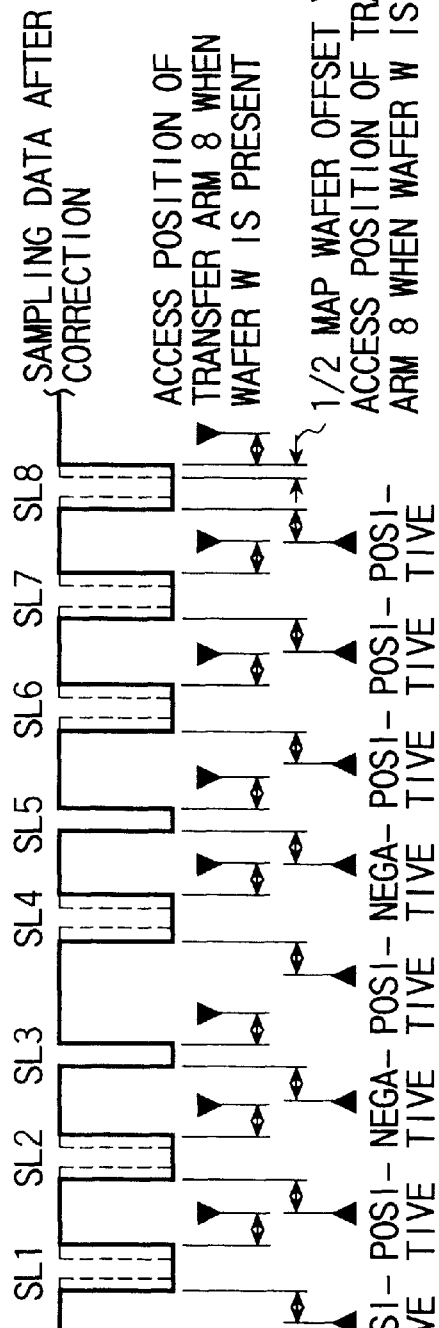
FIG. 17 is a schematic diagram to help explain the mapping process related to the embodiment.

At this time, if the ½ map wafer offset value is positive as shown in slots SL1, SL2, SL4, SL6, SL7, and SL8 of FIG. 17, the up position and down position, both being access positions of the transfer arm 8, will be determined (step S26).

The slot access position of the transfer arm 8 with no wafer W on the pick 8a of the transfer arm 8, that is, the up position as a result of a downward movement of the stage 14 (indexer Z-axis) after a wafer W has been loaded from the transfer chamber 2 into the cassette 12, is determined by the following expression:

the central position of each slot+(½ map wafer offset value)−the map position+the base position+the up offset value (1)

The slot access position of the transfer arm 8 with a wafer W on the pick 8a of the transfer arm 8, that is, the down position as a result of an upward movement of the stage 14 (indexer Z-axis) after the wafer has been loaded from the load/unload chamber 12 into the transfer chamber 2, is determined by the following expression:

the central position of each slot−the map position+the base position+the down offset value (2)

On the other hand, when the ½ map wafer offset value is negative (NO) as shown in slots SL3 and SL5 of FIG. 17, the up position and down position, both being access positions of the transfer arm 8, are determined (step S27).

The slot access position of the transfer arm 8 with no wafer W on the pick 8a of the transfer arm 8, that is, the up position as a result of a downward movement of the stage 14 (indexer Z-axis) after a wafer W has been loaded from the transfer chamber 2 into the cassette 12, is determined by the following expression:

the central position of each slot+(−½ map wafer offset value)−the map position+the base position+the up offset value (3)

The slot access position of the transfer arm 8 with a wafer W on the pick 8a of the transfer arm 8, that is, the down position as a result of an upward movement of the stage 14 (indexer Z-axis) after the wafer has been loaded from the load/unload chamber 12 into the transfer chamber 2, is determined by the following expression:

the central position of each slot−the map position+the base position+the down offset value−(−½ map wafer offset) (4)

If no wafer W has not been housed in each slot of the cassette 12 at step S24 (NO), that is, if a wafer W is loaded into an empty cassette, the up position and down position, both being access positions of the transfer arm 8, will be found (step S28).

Figure 18:
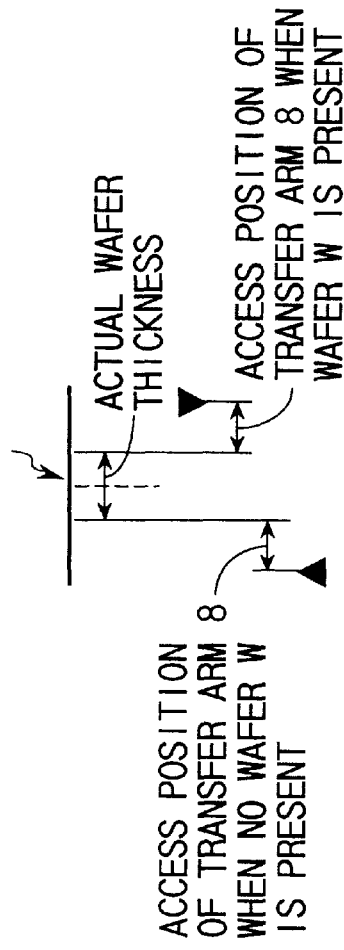
FIG. 18 is a schematic diagram to help explain the mapping process related to the embodiment.

Specifically, as shown in FIG. 18, the down position or up position using the actual wafer thickness as a reference is added to the reference slot position found in the calibration process, thereby calculating an access position of the transfer arm 8.

The up position is set using the following expression:

the central position of each slot−the map position+the base position+the up offset position+the empty cassette offset value (5)

As when wafers W have been housed in the cassette 12, the down position is set using the following expression:

the central position of each slot−the map position+the base position+the down offset value (6)

The up position and down position determined in step S26 and step S27 or step S28 are stored in the arithmetic control unit 10 (step S27).

The process is repeated as many times as the number of slots (step S30). When the position sensing has been done for all of the slots, this means that the arithmetic control unit 10 has stored all the up positions and down positions. Then, the arm access position sensing process is terminated.

Hereinafter, the operation of the transfer arm 8 on the basis of the access positions found in the arm access sensing process, that is, the transfer of a wafer W between the cassette 12 and the transfer chamber 2 will be explained.

The operation of the transfer arm 8 is composed of [1] the act of unloading a wafer W from the cassette 12 and [2] the act of loading a wafer W into the cassette 12.

The operation of the transfer arm 8 will be described in detail.

[1] Unloading a wafer W from the cassette 12

Figure 19:
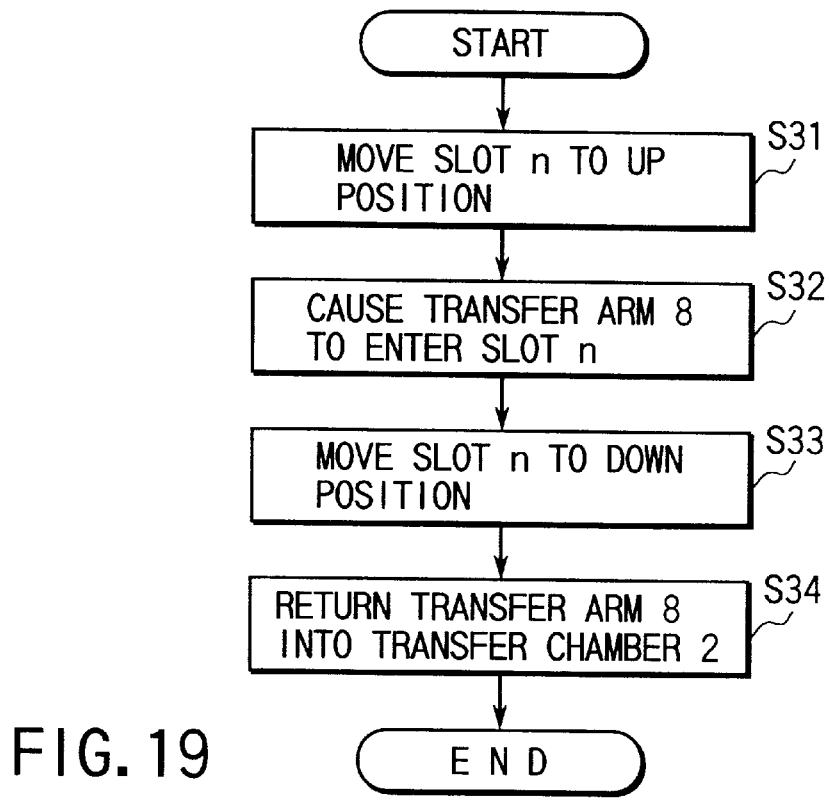
FIG. 19 is a flowchart for the operation of the transfer arm related to the embodiment.

The act of unloading a wafer W from the cassette 12 will be explained by reference to the flowchart of FIG. 19.

When a driving mechanism (not shown) has been operated by the signal from the arithmetic control unit 10, this causes the transfer arm 8 in the transfer chamber 2 goes into the load/unload chambers 6a, 6b. At the same time, under the control of the arithmetic control unit 10, the stage 14 moves on the basis of the up position determined in the mapping process and the transfer side of the transfer arm 8 is stopped at the up position of a specific slot (step S31).

Next, the transfer side of the transfer arm on which the pick 8a has been formed moves horizontally and enters slot n (step S32).

Thereafter, under the control of the arithmetic control unit 10, the stage 14 moves again and the transfer side of the transfer arm 8 is located in the down position (step S33). At this time, the wafer W is placed on the pick 8a of the transfer arm 8.

Then, the transfer arm 8 returns to the transfer chamber 2 (step S34), which completes the unloading of the wafer W from the specific slot into the transfer chamber 2.

[2] Loading a wafer W into the cassette 12

Figure 20:
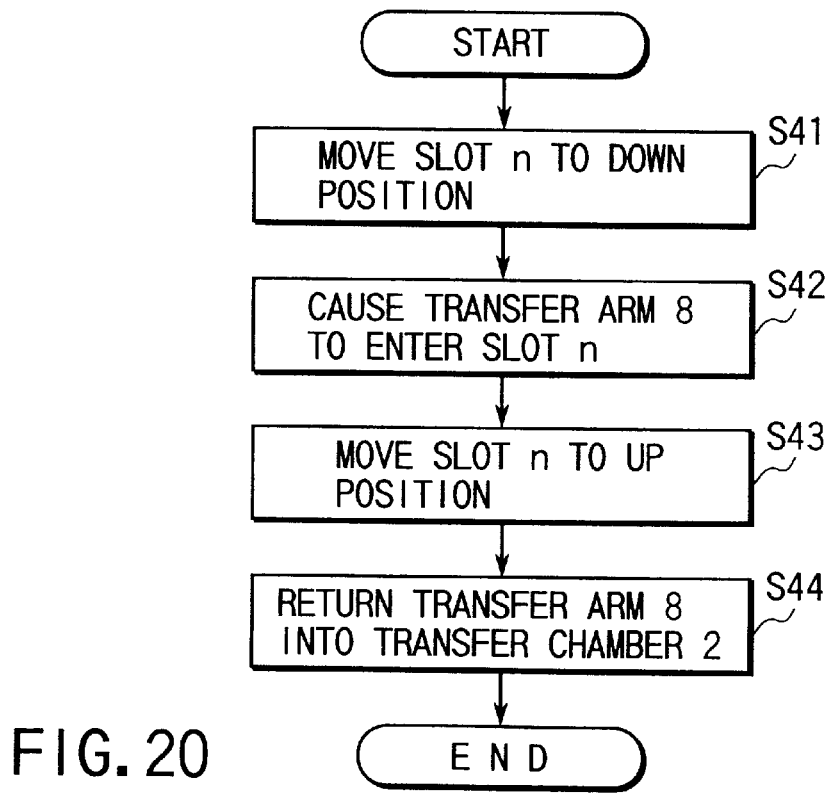
FIG. 20 is a flowchart for the operation of the transfer arm related to the embodiment.

Referring to the flowchart of FIG. 20, the act of loading a wafer W into the cassette 12 will be explained.

The transfer arm 8 on which the wafer W has been placed goes from the transfer chamber 2 into the load/unload chambers 6a or 6b. At the same time, under the control of the arithmetic control unit 10, the stage 14 moves on the basis of the down position determined in the mapping process and the transfer side of the transfer arm 8 is stopped at the position corresponding to the down position of a specific slot (step S41).

Next, the transfer side of the transfer arm 8 enters a specific slot n (step S42). Then, the stage 14 moves on the basis of the up position determined in the mapping process and the transfer side of the transfer arm 8 is located at the up position of a specific slot (step S43). At this time, the wafer W placed on the pick 8a of the transfer arm 8 is housed in the specific slot.

Then, the transfer arm 8 returns to the transfer chamber 2 (step S44), which completes the loading of the wafer W into the slot n.

As described above, the arm access position sensing method according to the embodiment comprises the calibration process of determining the offset value inherent to a cassette, the mapping process of sensing the state of each cassette used in the processing, and the arm access position sensing process of sensing the access positions of the transfer arm on the basis of the values calculated in the calibration process and the mapping process.

With the method of the embodiment, only one projection of the mapping beam on the top slot down to the bottom slot enables the optimum access position of the transfer arm to be sensed, leading to an increase in the throughput.

Furthermore, with the method, the state of the cassette and the sate of the wafers housed in the cassette can be sensed accurately, making it possible to transfer a wafer reliably in the desired state.

Even when, for example, a cross slot has taken place in a cassette, there is no possibility that the transfer arm will enter the slot and damage the wafer in the slot.

Furthermore, because the central position of each slot is corrected using the map wafer offset value, the direction in which the mapping beam is projected, for example, the parallelism of the mapping beam, need not be adjusted for each slot in each cassette. This helps shorten the time required to sense the access positions of the transfer arm.

The preferred embodiment of the present invention has been explained by reference to the accompanying drawings. The present invention is not limited the configuration described above and may be practiced or embodied in still other ways without departing from the spirit or essential character thereof.

For instance, while in the embodiment, explanation has been given using a wafer on which an orientation flat section has been formed, the present invention is not restricted to this and may be applied to a wafer provided with a suitable positioning device, such as a notch section, instead of the orientation flat section. The invention may, of course, be applied to a wafer without such a positioning device.

Furthermore, the present invention is applicable not only to the transfer of wafers but also the transfer of various types of objects to be processed, such as LCD glass substrates.

Moreover, in the embodiment, the transfer arm with a single pick or twin picks has been used. The present invention is not restricted to these and may be applied to the transfer arm with three or more picks.

While in the embodiment, the optical sensor composed of a pair of a light-emitting section and a light-receiving section has been provided in the load/unload chamber, the present invention is not limited to this. As long as a sensor capable of sensing at least each slot in a cassette and the state of an object to be processed in each slot is provided in a specific compartment for housing the cassette, the present invention can be applied.

Furthermore, while in the embodiment, the present invention has been applied to a multi-chamber semiconductor equipment system with a clustered tool structure, it is not restricted to this. As long as a system enables an object to be processed in a cassette housed in a specific chamber to be unloaded by the transfer arm or to be loaded into the cassette by the transfer arm, the present invention can be applied.

With the present invention, the access positions of the transfer arm are calculated in the arm access position sensing process on the basis of the offset value inherent to the cassette previously determined in the calibration process and the sampling thickness of the object to be process in each slot of the cassette determined for each cassette in the mapping process.

This enables only one projection of the mapping beam onto the cassette to sense the desire access position of the transfer arm. As a result, the time required to start the transfer of the object to be processed is shortened, resulting in an increase in the throughput.

Furthermore, in the sensing method of the present invention, the access position is determined on the basis of the relative positional relationship between the mapping beam and each slot in the cassette. This makes it possible to sense the access position without accurately adjusting the parallelism of the mapping beam.

Moreover, because each position is corrected on the basis of the map wafer offset value, the parallelism of the mapping beam need not be adjusted for each slot in each cassette, shortening the time required to sense the access position of the transfer arm. Even when the parallelism of the mapping beam has collapsed slightly, the sensing of the access position can be continued because each position has been corrected on the basis of the map wafer offset value.

Still furthermore, because a cassette and the state of the wafers in the cassette can be sensed reliably, this makes it possible to cause the transfer arm to access each slot in the cassette exactly and transfer the object to be processed in the desired state.

Moreover, even when a cross slot has taken place in a cassette, the transfer arm is prevented form entering the slot and damaging the object to be processed, because the occurrence of the cross slot is sensed reliably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method of sensing an access position of an arm that loads or unloads a wafer into or from a wafer cassette with slots for housing wafers, said arm access position sensing method comprising:

a calibration step of putting at least two reference wafers in the top and bottom reference slots, optically sensing the positions of these reference wafers, and calculating an offset value inherent to a reference wafer cassette;

a mapping step of optically sampling a processing wafer cassette and sensing the presence or absence of a wafer in each slot and information on an apparent thickness (sampling thickness) of said wafer in each of said slots; and the step of calculating an access position of said arm by correcting said sampling thickness on the basis of said offset value.

2. An arm access position sensing method according to claim 1, wherein said calibration step includes the step of causing said arm to come closer to said reference wafer cassette and said wafer until the arm has reached a specific position and sensing information on a reference position (base position) of said arm.

3. An arm access position sensing method according to claim 1, wherein said calibration step includes the step of projecting a light beam onto the edge sides of said two reference wafers housed in said reference cassette, finding the distance between the two shade centers of said light beam, and calculating a reference slot position by dividing the distance by (the number of all slots−1).

4. An arm access position sensing method according to claim 1, wherein said calibration step calculates the central positions (map positions) and apparent thicknesses (map thicknesses) of said reference wafers.

5. An arm access position sensing method according to claim 1, wherein said mapping step includes the step of projecting said light beam onto the edge sides of the wafers housed in said processing wafer cassette, comparing the shading center positions of said light beam related to said wafers with said reference slot positions, and generating an error signal for cross slot when the comparison value has exceeded a specific allowed value.

6. An arm access position sensing method according to claim 4, wherein said mapping step includes the step of calculating the difference between said sampling thickness and said map thickness (map wafer offset value).

7. An arm access position sensing method according to claim 6, wherein said mapping step includes the step of correcting a preset actual wafer thickness on the basis of said map wafer offset value determined for each of said slots and calculating the pitch distance on the basis of information on the corrected wafer thickness.

8. An arm access position sensing method according to claim 7, wherein said pitch distance calculating step includes the step of comparing the calculated distance with a preset allowed value (slot pitch allowed value) and generating an error signal when the calculated distance has exceeded the allowed value.

9. An arm access position sensing method according to claim 7, wherein said mapping step includes the step of generating an error signal when said corrected wafer thickness is smaller than a specific transfer allowable wafer thickness.

10. An arm access position sensing method according to claim 1, wherein said arm access position sensing step includes the step of correcting said reference slot positions determined in said calibration step on the basis of an offset value using said actual wafer thickness as a reference, when it has been judged in said mapping step that none of said wafers are present.

11. An arm access position sensing method according to claim 1, wherein said arm access position sensing step calculates the arm access positions of said arm on the basis of the wafer thickness corrected in said mapping step, when it has been judged in said mapping step that said wafers are present.

12. An arm access position sensing method according to claim 1, wherein said calibration step includes a horizontality adjusting step of adjusting the horizontality of a cassette stage on which said reference wafer cassette is placed so that the horizontality may be in the range of allowed values.

13. An arm access position sensing method according to claim 1, wherein said calibration step includes a horizontality adjusting step of adjusting the horizontality of said arm so that the horizontality may be in the range of allowed values.

14. A method of setting an access position of an arm with respect to a processing wafer cassette in a processing system to which a transfer chamber including a transfer mechanism with an arm for transferring a wafer, a process chamber for subjecting said wafer to specific processes, and a load/unload chamber for housing a processing cassette that holds unprocessed or processed wafers and having an optical sensor for sensing the edge sides of said wafers, are connected, with the process chamber and load/unload chamber being arranged around said transfer chamber, said access position sensing method comprising:

an arm horizontal adjusting step of horizontally adjusting the movement of said wafer held by said arm;

a stage horizontal adjusting step of horizontally adjusting the mounting surface of a stage on which said processing wafer cassette in said load/unload chamber is placed;

an adjusting wafer cassette checking step of checking to see if an adjusting wafer cassette has a A-determined shape (offset);

a base position sensing step of putting reference wafers in the top and bottom slots of said adjusting wafer cassette, causing said arm to approach the back of the wafer in said bottom slot, and determining the position at which the arm first comes into contact with the wafer to be a base position;

a mapping start position setting step of causing said optical sensor to sense the position of said reference wafer in the top slot of said adjusting wafer cassette and setting the position as a mapping start position;

a reference slot position calculating step of causing said optical sensor to sense the positions of said reference wafers in the top slot and bottom slot of said adjusting wafer cassette on said stage and calculating the position of each of the reference slots;

a mapping step of putting wafers to be processed in the top slot down to the bottom slot of a processing wafer cassette, placing the cassette on said stage, causing said optical sensor to sense the positions of wafers to be processed, calculating the presence or absence and thickness of wafers to be processed and the position of each slot, judging whether said slot position is within an allowed range predetermined on the basis of said reference slot position, and determining whether or not said wafer cassette can be used; and an arm access position setting step of correcting the positions of the slots in the processing wafer cassette on the basis of the reference information found using said adjusting wafer cassette and setting an access position of the arm that unloads or loads a wafer to be processed from or into said processing cassette.

15. An arm access position sensing method according to claim 14, wherein said arm horizontal adjusting step places a wafer on a pick of said arm and adjusts said arm so that the back of the wafer W may be almost in parallel with the inner bottom surface of a transfer chamber set in a horizontal plane, with a specific distance between them.

16. An arm access position sensing method according to claim 14, wherein said stage horizontal adjusting step makes compensation by tilting said stage according to the inclination, when said wafer has a cutout section, such as an orientation flat section or a notch section, is housed with said cutout section aligning with the back of said adjusting cassette, opposite to its opening, and when the wafer has tilted in a slot.

17. An arm access position sensing method according to claim 14, wherein said adjusting wafer cassette distance A' between said mounting surface and specific point A on the front of the opening of the adjusting wafer cassette at the back of wafer in the bottom slot, distance B' between said mounting surface and specific point B on the back of the adjusting wafer cassette at the back of wafer in the bottom slot, distance C' and distance D' between said mounting surface and point C and point D set in almost symmetric positions on the load/unload side of the adjusting wafer cassette, respectively, with a line connecting said point A to point B running between point C and point D, distance E' between said point C and said point D, distance $\alpha'$ between said mounting surface and point $\alpha$ on the wafer in the top slot corresponding to point A on the wafer in the bottom slot, and distance $\beta'$ between said mounting surface and point $\beta$ on the wafer in the top slot corresponding to point B on the wafer in the bottom slot, the distances A', B', C', C', E', (A'-B'), (C'-D') of the bottom slot, the distances $\alpha',\beta'$ of the top slot, and a pitch distance of $\{(\alpha'+\beta')-(A'+B')\}/2$ conform to predetermined reference values or lie in predetermined allowed ranges.

18. An arm access position sensing method according to claim 14, wherein said mapping start position setting step sets a mapping start position to the position in which said reference wafer in the top slot of said adjusting wafer cassette has been sensed with optical sensors arranged on a line connecting the front of the opening of said adjusting wafer cassette to its back.

19. An arm access position sensing method according to claim 14, wherein said reference slot position calculating step places said adjusting wafer cassette that houses wafers in the top slot and bottom slot on said stage, moves said adjusting wafer cassette upward, senses the positions of the wafers in the top slot down to the bottom slot, binarizes the positions, and calculates the central position of each wafer, and divides the distance between the calculated two central positions by (the number of slots−1) to find a reference slot position, senses the map position or the central position of a wafer housed in the bottom slot and the map thickness or apparent thickness of the wafer, measures the difference between the map thickness and that of said reference wafer, and calculates a map wafer offset.

\* \* \* \* \*